US008238160B2

(12) United States Patent
Kim et al.

(10) Patent No.: US 8,238,160 B2
(45) Date of Patent: Aug. 7, 2012

(54) NONVOLATILE MEMORY DEVICE AND MEMORY SYSTEM HAVING THE SAME

(75) Inventors: Soo-Han Kim, Hwaseong-si (KR); Dae Han Kim, Seoul (KR)

(73) Assignee: Samsung Electronics, Co., Ltd., Suwon-Si, Gyeonggi-Do (CN)

( * ) Notice: Subject to any disclaimer, the term of this patent is extended or adjusted under 35 U.S.C. 154(b) by 345 days.

(21) Appl. No.: 12/639,119

(22) Filed: Dec. 16, 2009

(65) Prior Publication Data
US 2010/0214843 A1   Aug. 26, 2010

(30) Foreign Application Priority Data
Feb. 25, 2009 (KR) .................. 10-2009-0015933

(51) Int. Cl.
G11C 16/04   (2006.01)

(52) U.S. Cl. ......... 365/185.18; 365/185.19; 365/185.22; 365/185.24; 365/185.23

(58) Field of Classification Search ............. 365/185.18, 365/185.19, 185.22, 185.24, 185.23
See application file for complete search history.

(56) References Cited

U.S. PATENT DOCUMENTS

| | | | | |
|---|---|---|---|---|
| 6,301,151 B1* | 10/2001 | Engh et al. | ............... | 365/185.03 |
| 6,459,621 B1* | 10/2002 | Kawahara et al. | ....... | 365/185.24 |
| 6,970,380 B1* | 11/2005 | Yeh et al. | ................. | 365/185.03 |
| 7,188,036 B2* | 3/2007 | Strittmatter | ..................... | 702/57 |
| 7,218,570 B2 | 5/2007 | So et al. | | |
| 7,218,579 B2 | 5/2007 | Lin et al. | | |
| 7,269,066 B2* | 9/2007 | Nguyen et al. | ........... | 365/185.17 |
| 7,679,977 B2* | 3/2010 | Shirakawa | .................... | 365/201 |
| 7,688,632 B2* | 3/2010 | Nagashima et al. | ..... | 365/185.19 |
| 7,692,970 B2* | 4/2010 | Park et al. | ................ | 365/185.22 |
| 7,859,910 B2* | 12/2010 | Shiga | ....................... | 365/185.24 |
| 2006/0291287 A1 | 12/2006 | Furnemont | | |

FOREIGN PATENT DOCUMENTS

JP   2000-076878   3/2000
JP   2002-288988   10/2002

* cited by examiner

Primary Examiner — Viet Q Nguyen
(74) Attorney, Agent, or Firm — F. Chau & Associates, LLC

(57) ABSTRACT

A non-volatile memory device including a cell array having memory cells arranged at intersections of word lines and bit lines; an address decoder configured to select one of the word lines in response to an address; a write circuit configured to write program data in memory cells connected with the selected word line; and a control circuit configured to control the address decoder and the write circuit such that a plurality of band program (write) operations are sequentially executed during a write operation, wherein the control circuit is further configured to select each band write operation the optimal write condition of the next band write operation. A plurality of available write conditions are stored as trim information in a plurality of registers. The control circuit selects the register storing information for performing programming under the optimal write condition.

14 Claims, 13 Drawing Sheets

Fig. 13

| BR | Vstart | Vstep | tPGM | PGM Cell | Vfy | Muliti vfy | Vfy Level | Vfy 1 Level | ... | Vfy N Level | Band Max | Max Loop |
|---|---|---|---|---|---|---|---|---|---|---|---|---|
| BR0 | 2V | 2V | 500ns | 16 Cell | Disable | Disable | - | - | | - | 2 | 64 |
| BR1 | 6V | - | 500ns | 16 Cell | Disable | Enable | - | 4V | | 5V | - | 64 |
| BR2 | 6.5V | 0.27V | 300ns | 8 Cell | Disable | Disable | - | - | | - | 5 | 64 |
| BR3 | 6.4V | 0.25V | 300ns | 8 Cell | Disable | Disable | - | - | | - | 5 | 64 |
| BR4 | 6.3V | 0.22V | 300ns | 8 Cell | Disable | Disable | - | - | | - | 5 | 64 |
| BR5 | 6.2V | 0.2V | 300ns | 8 Cell | Disable | Disable | - | - | | - | 5 | 64 |
| BR6 | 7V | 0V | 400ns | 16 Cell | Enable | Disable | 6.7V | - | | - | 10 | 64 |
| BR7 | 7.2V | 0V | 400ns | 16 Cell | Enable | Disable | 6.7V | - | | - | 10 | 64 |

NONVOLATILE MEMORY DEVICE AND MEMORY SYSTEM HAVING THE SAME

CROSS-REFERENCE TO RELATED APPLICATIONS

This application claims the priority, under 35 U.S.C. §119, of Korean Patent Application No. 10-2009-0015933 filed Feb. 25, 2009, the entirety of which is incorporated by reference herein.

BACKGROUND OF THE INVENTION

1. Field of the Invention

The present invention relates to a non-volatile memory device and a memory system including the same.

2. Description of the Related Art

A flash memory device is a non-volatile memory device that retains stored data after power is turned off. Flash memory devices can be implemented a semiconductor memory devices capable of being electrically erased and programmed. Flash memory has been applied to mobile devices for executable code storage memories and as mass storage devices of mobile devices necessitate high-density and high-speed characteristics.

The flash memory devices may be classified as NAND flash memory devices or as NOR flash memory devices. A NOR flash memory device has a traditional memory cell structure having a plurality of memory cells connected in parallel to one bit line. By contrast, in a NAND flash memory device, a plurality of memory cells are connected in series with one bit line. The NOR flash memory device may perform program and read operation more rapidly than the NAND flash memory device. For this reason, the NOR flash memory devices have been widely used in applications that require rapid read/program speed.

But, the NOR flash memory device can be more difficult to miniaturize on a semiconductor chip with increasing storage capacity as compared with the NAND flash memory device. A multi level cell (MLC) storage system where plural data bits are stored in one physical memory cell has been adopted to increase the storage capacity without increasing chip size.

SUMMARY OF THE INVENTION

One aspect of the invention provides a non-volatile memory device which comprises a cell array having memory cells arranged at intersections of word lines and bit lines; an address decoder configured to select one of the word lines in response to an address; a write circuit configured to write program data in memory cells connected with the selected word line; and a control circuit configured to control the address decoder and the write circuit such that a plurality of band program (write) operations are sequentially executed during a write operation, wherein during each band write operation, the control circuit is further configured to select a write condition of a next band write operation.

Another aspect the invention provides a memory system comprising a non-volatile memory device; and a memory controller configured to control the non-volatile memory device. The non-volatile memory device comprises a cell array having memory cells arranged at intersections of word lines and bit lines; an address decoder configured to select one of the word lines in response to an address; a write circuit configured to write program data in memory cells connected with the selected word line; and a control circuit configured to control the address decoder and the write circuit such that a plurality of band write operations are sequentially executed during a write operation, wherein during each band write operation, the control circuit is further configured to select a write condition of a next band write operation.

During a write operation, a non-volatile memory device according to an embodiment of the invention may sequentially perform a plurality of band write operations and select an optimized write condition to be used for a next band write operation at a band write operation. The non-volatile memory device according to an embodiment of the invention may conduct a write operation by using an optimized write condition.

Various exemplary embodiments of the invention will be hereinafter described in detail with reference to the accompanying drawings. The invention may however be embodied in different forms and should not be construed as limited to the embodiments set forth herein. Rather, these embodiments are provided so that this disclosure will be thorough and complete, and will fully convey the scope of the embodiments to those skilled in the art. Like reference numerals refer to like elements throughout the accompanying figures.

BRIEF DESCRIPTION OF THE FIGURES

The above and other features of the present invention will become apparent from the following description with reference to the following figures, wherein like reference numerals refer to like parts throughout the various figures unless otherwise specified, and wherein:

FIG. 13 is a table showing exemplary trim information stored in band registers BR0 to BR7 according to an exemplary embodiment of the invention.

DETAILED DESCRIPTION OF EXEMPLARY EMBODIMENTS OF THE INVENTION

Figure 1:
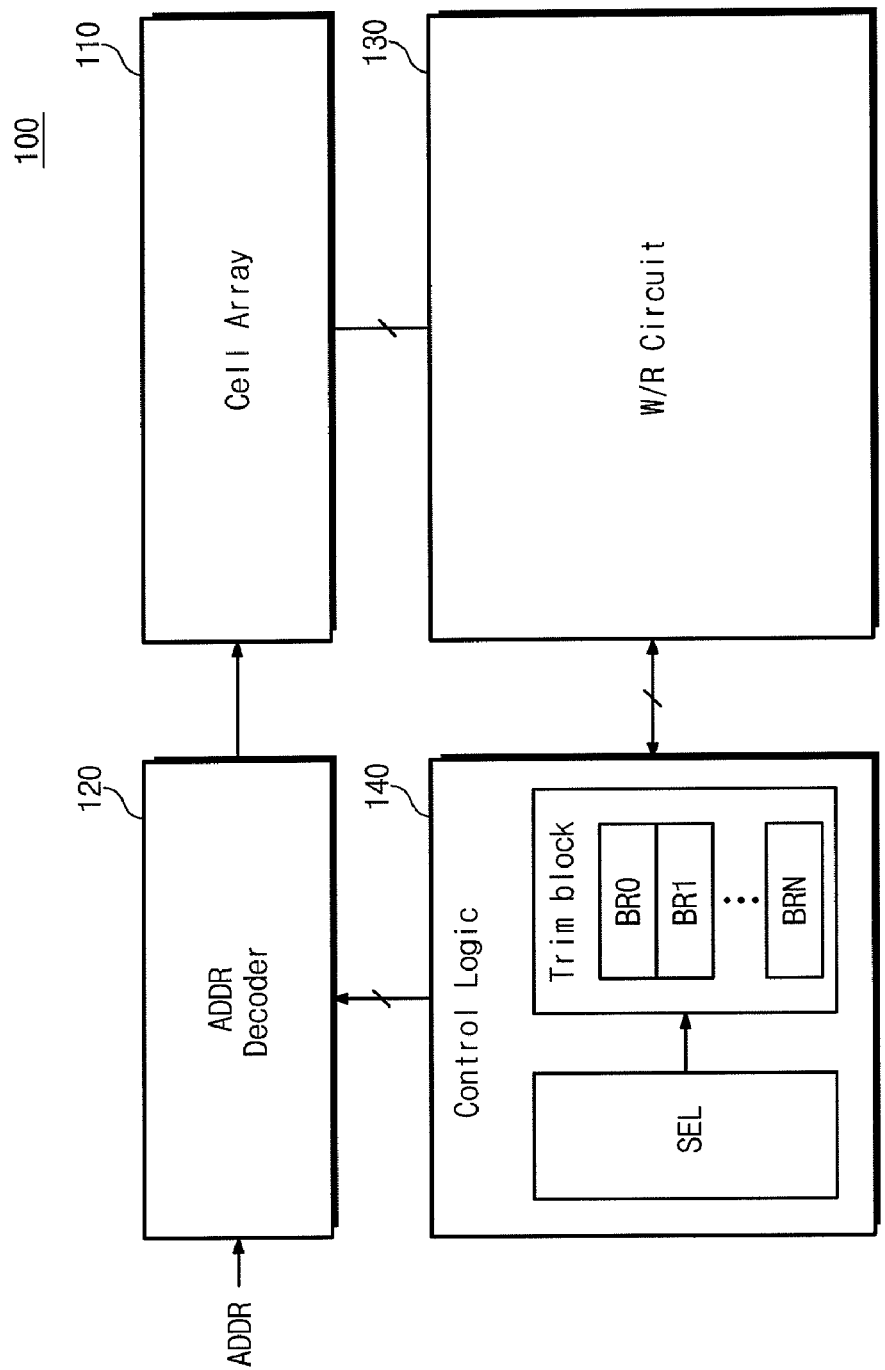
FIG. 1 is a block diagram of a non-volatile memory device 100 according to an embodiment of the invention.

FIG. 1 is a block diagram of a non-volatile memory device 100 according to an exemplary embodiment of the invention.

Referring to FIG. 1, the non-volatile memory device 100 includes a cell array 110, an address decoder 120, a write/read circuit 130, and control logic 140. The control logic 140 may be configured to select a band register including an optimized write condition during a write operation and to control the write operation according to the optimized write condition of the selected band register.

The cell array 110 may include a plurality of memory cells arranged at each intersection of word lines and bit lines. Each memory cell on a selected word line may be turned ON or OFF according to a voltage supplied to the selected word line. The turn-ON/OFF states of memory cells controls current flow through the bit lines. Program data of each memory cell may be judged by sensing bit line current.

The address decoder 120 receives address bits ADDR to select a memory block of the cell array 110 and a word line of the selected memory block. The address decoder 120 may be configured to include a word line voltage generator (not shown) that generates a word line voltage to be applied to a selected word line. The write/read circuit 130 may include a write circuit (not shown) for writing received programming data in the cell array 110 and a read circuit (not shown) for reading stored data out from the cell array 110.

The control logic 140 may be configured to control the overall operation of the non-volatile memory device 100. In particular, the control logic 140 may control the address decoder 120 and the write/read circuit 130 such that a plurality of program operations are carried out sequentially. This will be more fully described with reference to FIG. 3.

The control logic 140 may be configured to select a band register in which optimized 'trim' information is stored, during each band write operation. Herein, the trim information is information needed to decide how perform a write operation and includes a start voltage level, a step level, a loop number, a program time, and the like. The control logic 140 may include a selector circuit 142 and a trim (information storage) block 144. The selector circuit 142 may be configured to select a band register of the trim block 144, that has an optimized write condition, during each band write operation. The trim block 144 may include a plurality of N+1 band registers (BR0, BR1 ... BRN), each of which is configured to store trim information for adjusting a write condition.

A conventional non-volatile memory device may perform all write operations according to a fixed write/trim condition. By contrast, the non-volatile memory device 110 according to an embodiment of the invention may be configured to select an optimized write condition during each write operation and perform each write operation according to its selected write condition. Optimizing of each write condition provides the benefit that the threshold voltage margin is widened and/or that a write time is reduced. Accordingly, the non-volatile memory device 100 according to an embodiment of the invention may improve the write performance by operating with consideration for an optimized write condition during each write operation.

Figure 2:
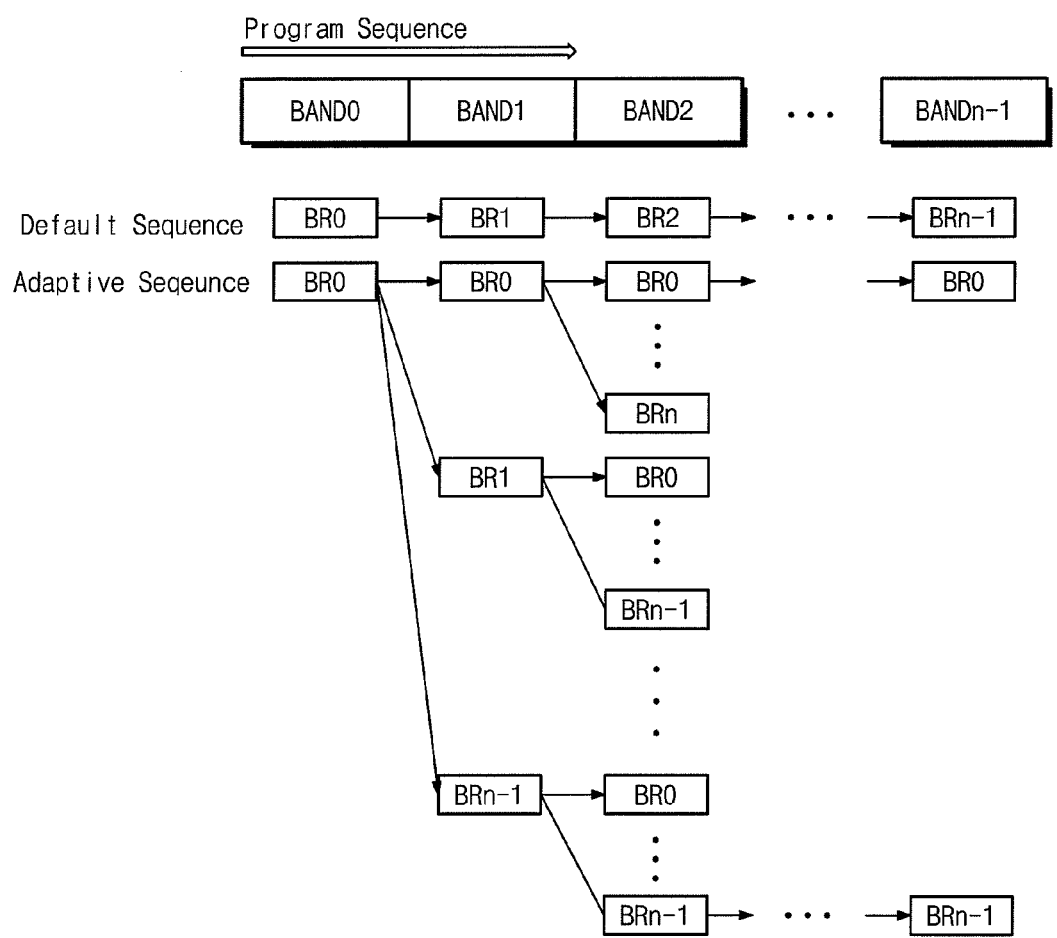
FIG. 2 is a diagram showing a programming sequence of a non-volatile memory device 100 of FIG. 1.

FIG. 2 is a diagram showing an exemplary programming sequence of the non-volatile memory device 100 of FIG. 1.

Referring to FIG. 2, an optimized write operation according to a method embodiment of the invention may be made by sequentially performing a plurality of N (where n=N+1) band program operations BAND0 to BANDn−1. Within each of the N band program operations BAND0 to BANDn−1, each program operation may be optimized according to trim information stored in a band register selected by control logic 140.

As illustrated in FIG. 2, band program operations may be carried out according to a default sequence or an adaptive sequence. In case of the adaptive sequence, a program operation may be performed via various paths that are selected by the selector circuit 142 in the control logic 140 in the device 100 of FIG. 1. Thus, the program operation in each band may be carried out according to trim information of a default band register (e.g., BR0) or according to trim information of a selected band register selected from N band registers BR0-BRN.

The non-volatile memory device 100 of FIG. 1 may be configured so that during each write operation, a selected a band register includes an optimized write condition for that band. But, the non-volatile memory device 100 according to an embodiment of the invention is not limited to this implementation. For example, the non-volatile memory device 100 is capable of being configured to determine selection of a band register including an optimized write condition, every band.

In an exemplary embodiment, a verification operation may be used to select an optimized write condition at each band program operation. The verification operation may analyze the threshold voltage distribution of programmed cells and select an optimized write condition according to the result. But, it is the selection of an optimized write condition is not limited to the verification operation.

Figure 3:
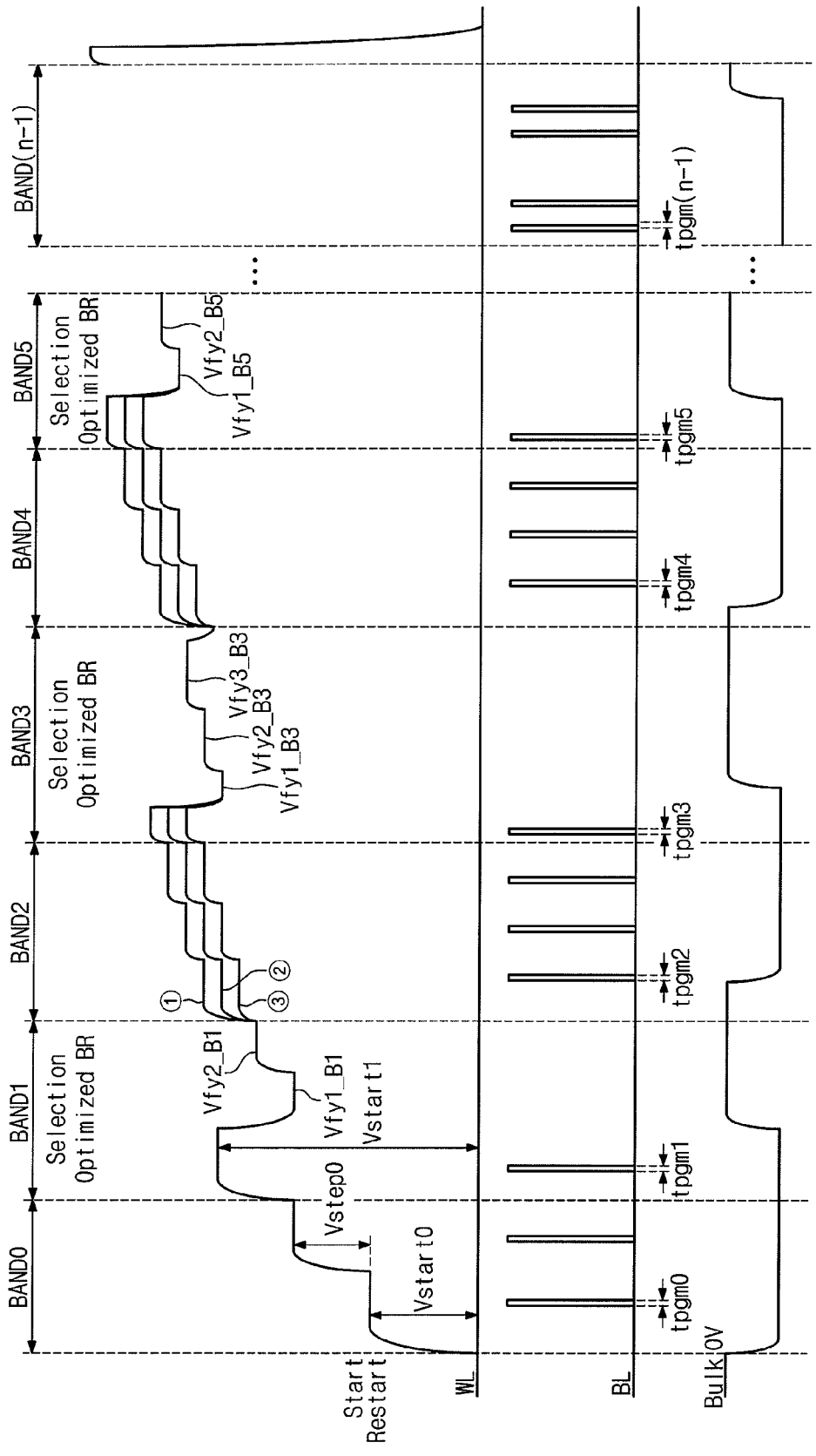
FIG. 3 is a time-voltage diagram showing voltages used in each band during a write operation of the non-volatile memory device 100 of FIG. 1.

FIG. 3 is a time-voltage diagram showing voltages used in each band during a write operation of the non-volatile memory device 100 of FIG. 1. For ease of description, it is assumed that the non-volatile memory device 100 is a NOR flash memory device. However, the non-volatile memory device 100 according to different embodiments of the invention can be a NAND flash memory device. As illustrated in FIG. 3, during a write operation, a word line, a bit line, and a bulk may be biased by high voltages selected as follows.

Figure 7:
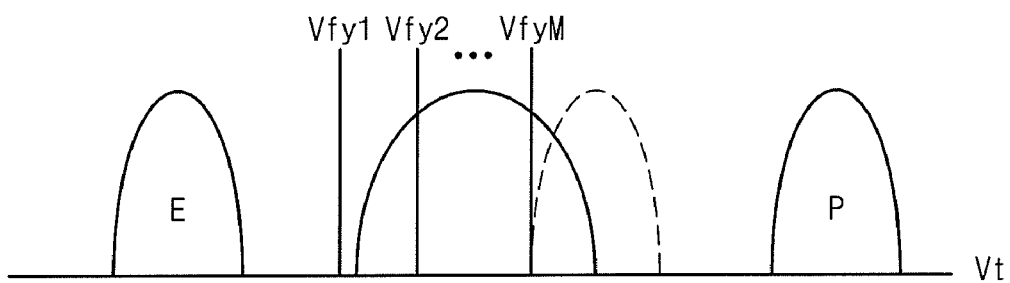
FIG. 7 is a distribution graph for verification levels in FIG. 6.

In the first band BAND0, a program operation may be carried out according to trim information stored in the first band register BR0. The trim information of the first band register BR0 may include a start voltage level Vstart0, information indicating a verification operation, a step level Vstep0, information indicating a multi-verification operation, a simultaneous program cell number, a program time tpgm0, a maximum band loop number, a maximum ISPP loop number and the like. A multi-verification operation means that a verification operation is performed iteratively using different verification voltages, as illustrated in FIG. 7. Herein, if information indicating a multi-verification operation is included in the trim information, the verification operation may be skipped. On the other hand, if no information indicating a multi-verification operation is included in the trim information (or, if the trim information includes multi-verification disable information), a well-known verification operation may be performed. And, it is possible to skip the well-known verification operation regardless of the multi-verification operation.

In case of a cell to be programmed, a bit line voltage may be supplied to a bit line connected with the cell to be programmed, during a program time tpgm0. The first band BAND0 does not include a multi-verification operation.

As illustrated in FIG. 3, a maximum band loop number of the first band BAND0 is 2. Accordingly, after a high voltage of (Vstart+Vstep) is applied to a word line during a given time, a program operation of the first band BAND0 may be completed. Afterwards, a program operation of the second band BAND1 may commence.

Since a multi-verification operation is not carried out, the program operation of the second band BAND1 may be conducted according to trim information stored in the second band register BR1 as a default band register. The trim information of the second band register BR1 may include a start voltage level Vstart1, information indicating a verification operation, a step level Vstep1, information indicating a multi-verification operation, a simultaneous program cell number, a program time tpgm1, a maximum band loop number, and the like. In case of a cell to be programmed, a bit line voltage may be supplied to a bit line connected with the cell to be programmed, during a program time tpgm1. During programming, a negative voltage may be supplied to the bulk semiconductor (substrate, not shown).

In case of the third band BAND2, after a start voltage Vstart1 is applied to a word line during a given time, there may be conducted a multi-verification operation (a plurality of verification operations) for selecting an optimal band register to be used for next band (BAND 3). The multi-verification operation comprises plural verification operations that may be carried out using the first verification level Vfy1_B1 and the second verification level Vfy2_B1. An optimal band register to be used at a next band BAND2 may be selected according to a threshold voltage distribution of programmed cells analyzed via the multiple verification operations.

For example, in the third band BAND2, a word line may be driven by a word line voltage determined according to three components of the optimized trim information. One of the three components may be selected from a band register including optimized trim information. The selected band register may be a currently used band register or a new band register.

While the verification operation is carried out, a bulk may be biased by 0V. If a program operation of the second band BAND1 is completed, a program operation of the third band BAND2 may commence according to the trim information of the selected optimal band register.

In the third band BAND2, a program operation may commence according to the trim information of the selected optimal band register. The selected optimal band register preferably stores optimized trim information according to the analyzed threshold voltage distribution characteristic. When the program operation of the third band BAND2 is ended, the program operation of the fourth band BAND3 may commence.

In the fourth band BAND3, a program operation may be made according to trim information stored in the fourth band register BR3 being a default band register. For a cell to be programmed, a bit line voltage may be supplied to the bit line connected with the cell to be programmed, during a program time tpgm3. During programming, a negative voltage may be supplied to the bulk.

In the fourth band BAND3, there may be conducted a multi-verification operation (a plurality of verification operations) for selecting an optimal band register to be used for a next band. The multi-verification operation is plural verification operations that may be carried out using the first verification level Vfy1_B3, the second verification level Vfy2_B3, and the third verification level Vfy3_B3. An optimal band register to be used at a next band BAND2 may be selected according to the threshold voltage distribution of programmed cells analyzed via the multiple verification operations. Thus, in the multi-verification operation of the fourth band BAND3, the trim information may be selected as optimized trim information for the fifth band BAND4.

While the verification operation is performed, the bulk may be biased by 0V. When the program operation of the fourth band BAND3 is completed, a program operation of the fifth band BAND4 may commence according to trim information of the selected and optimal band register.

In the fifth band BAND4, a program operation may commence according to the trim information of the selected and optimal band register. Preferably, in the selected optimal band register is stored optimized trim information according to the analyzed threshold voltage distribution characteristic. When the program operation of the fifth band BAND4 is ended, a program operation of the sixth band BAND5 may commence.

Program operations of the remaining bands may be carried out in the above-described manner. If no further program cell exists, a write operation may be terminated. If program cells exist after termination of the last band BANDn−1, a program operation may be again carried out from the first band BAND0. In this case, a maximum band loop number (or, a maximum restart number) may be set to a predetermined value.

A write operation according to an embodiment of the invention may include a plurality of band program operations that are carried out sequentially. In each band, a program operation may be carried out according to trim information stored in a default band register. A program operation may alternatively be carried out according to trim information stored in an optimal band register selected based on a multi-verification operation. In this write scheme, each write operation may be performed according to an optimized write condition.

The optimized write condition is decided according to a program cell characteristic. But, deciding the optimized write condition is not limited to the program cell characteristic. The optimized write condition may be determined according to considerations such as reduction of a program time, best affect on chip operations, and the like.

Figure 4:
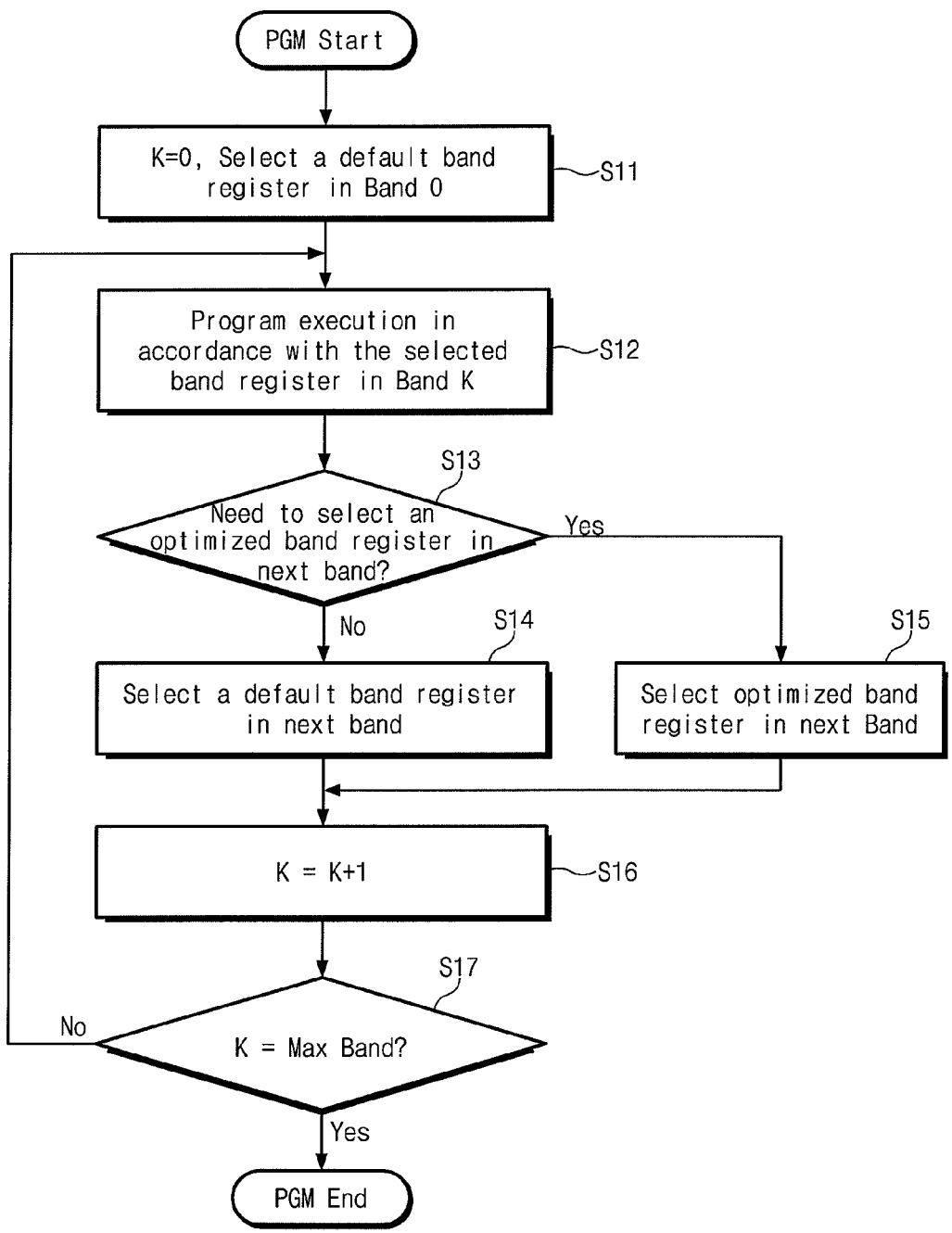
FIG. 4 is a flowchart of a first write method of the non-volatile memory device 100 of FIG. 1.

FIG. 4 is a flowchart of a first write method performed in the non-volatile memory device 100 of FIG. 1.

First, when cell programming is initiated, in selection step S11, a band loop count variable K indicating a selected band is set to 0 as a default band register (e.g., 0) to performing the program operation of the first band BAND0. In step S12, a program operation may be executed according to the selected band register K, (e.g., first a default band register, in the first band BAND0).

In decision step S13, it is decided whether it is necessary to select an optimal band register for a next program operation of a next band BAND (e.g., K=K+1). This may be decided based on trim information stored in a selected band register. The stored trim information may include information indicating whether or not there should be a selection of an optimal band register. For example, information provided by a multi-verification operation may be used to judge whether or not there should be a selection of an optimal band register. Whether or not to select an optimal band register may be decided based on a threshold voltage distribution of programmed cells which is analyzed via the multi-verification operation.

If it is decided to be unnecessary to select an optimal band register (No branch of decision step S13), then in S14, a band register to be used in a next band may be set to a default band register, and the method proceeds to step S16. If it is decided necessary to select an optimal band register (Yes branch of decision step S13), in S15, an optimal band register to be used in a next band is selected and the method proceeds to step S16. In count increment step S16, the variable K is increased by 1. In decision step S17, it is decided whether the variable K is equal to a predetermined maximum band loop number. If K equals the predetermined maximum band loop number (Yes branch of decision step S17), then the write operation may be terminated. If the variable K is not equal to the predetermined maximum band loop number (No branch of decision step S17), the method goes back to step S12.

Figure 5:
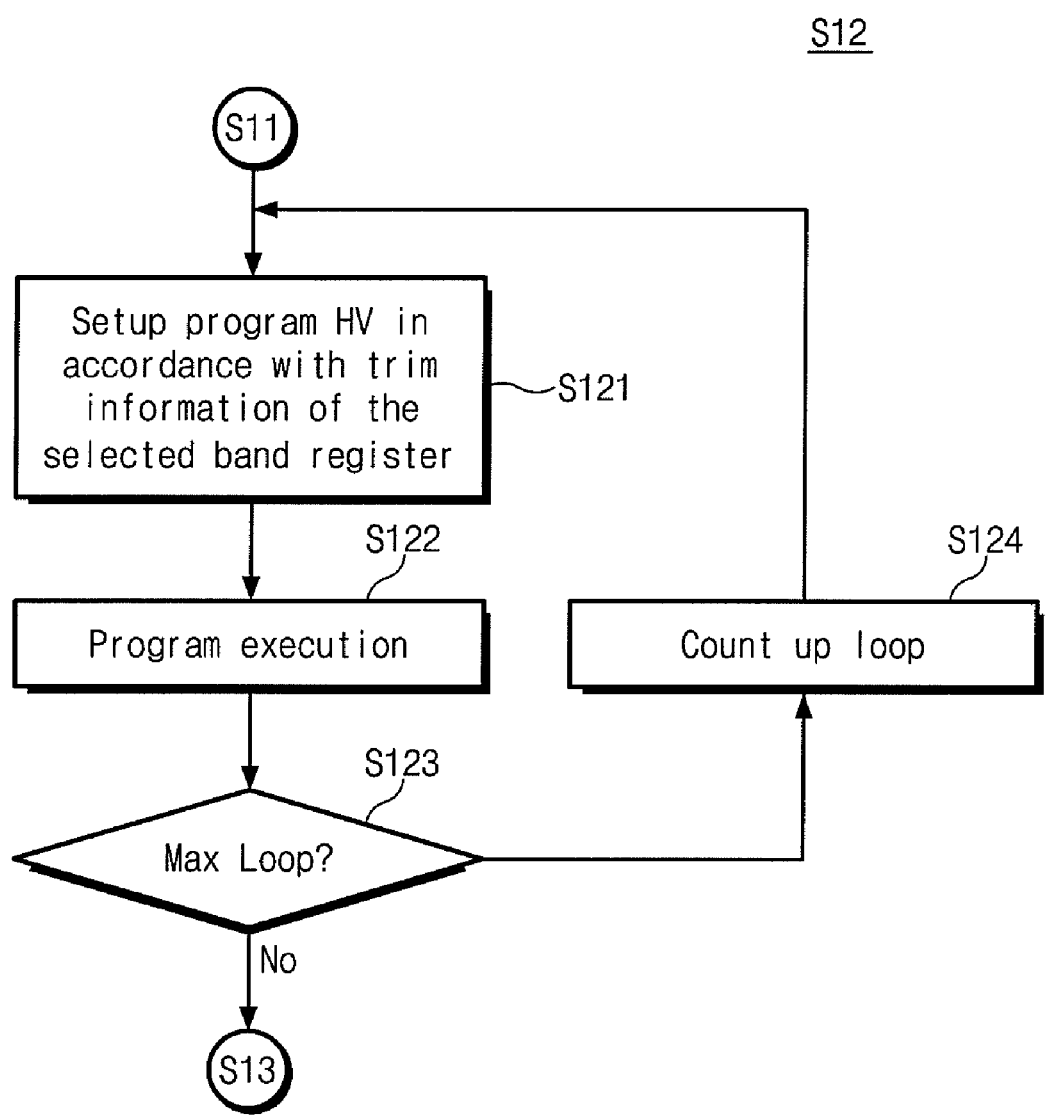
FIG. 5 is a flowchart describing programming step S12 in FIG. 4 in greater detail.

FIG. 5 is a flowchart for describing programming step S12 in FIG. 4 in greater detail.

Referring to FIG. 5, in step S121, there a high voltage is prepared according to trim information of the selected band register during a band program operation. For example, a high voltage generator (not shown) may generate voltages to be applied to a word line, to a bit line, and to a bulk according to trim information of the selected band register, as illustrated in FIG. 3. In step S122, the program operation is executed by applying the generated voltages to the word line, to the bit line, and to the bulk. Each band program operation may be executed in an Increment Step Pulse Programming (ISPP) manner, using a loop counter. In decision step S123, it is judged whether the current loop is the maximum loop. If so, the procedure goes to step S13. If not, the ISPP procedure goes to step S124, in which a loop number is increased by one, and then steps S121, S122 and S123 are repeated. The above-described operation may be repeated until the current loop reaches the maximum loop.

Herein, the maximum loop (referred to as a maximum program loop number) indicates the number of ISPP program loops that are executed within a selected band. The value of the maximum ISPP loop number may be included in trim information of the selected band register.

Figure 6:
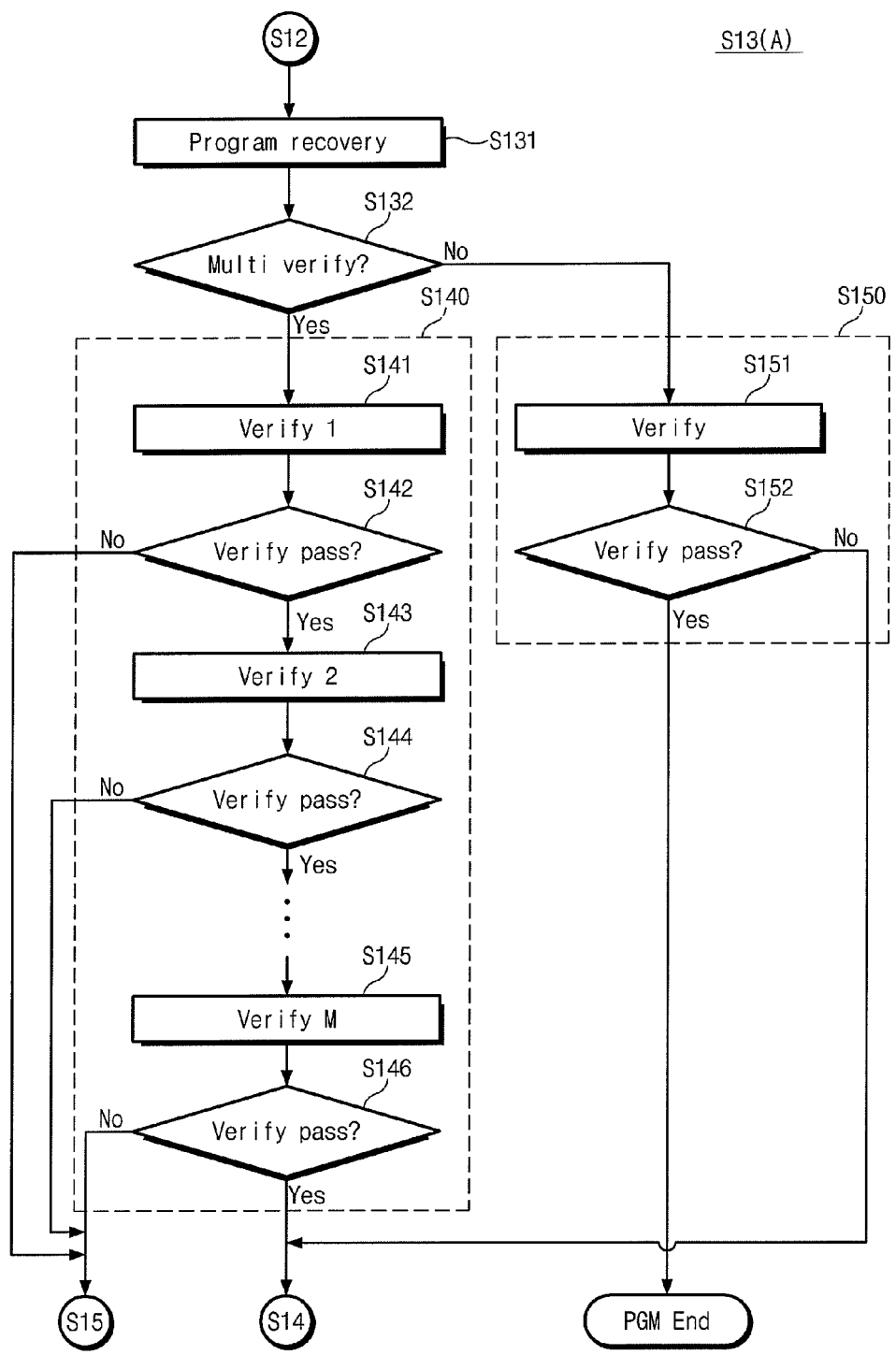
FIG. 6 is a flowchart describing a verification operation of step S13 in FIG. 4 according to the first exemplary embodiment.

FIG. 6 is a flowchart describing the verification operation of step S13 in FIG. 4 according to a first exemplary embodiment, and FIG. 7 is a distribution graph showing verification levels in FIG. 6

After a program operation is executed in step S12 (see FIGS. 4 & 5), a program recovery operation may be performed for deciding whether to select an optimal band register. A program recovery operation is performed in step S131 of FIG. 6. In decision step S132, it is decided whether a multi-verification operation is selected. In other words, it is decided whether information stored in the selected band register is set to execute the multi-verification operation. The 'multi-verify' operation S132 means that a verification operation is performed iteratively using different verification voltages, as illustrated in FIG. 7. If the multi-verification operation is judged to be selected (Yes), the procedure goes to step S140. If the multi-verification operation is judged not to be selected (No), the procedure goes to step S150 (substep S151).

In step S140, a multi-verification operation is executed. First, in substep S141, a verification operation for programmed cells may be executed based on the first verification voltage Vfy1. In decision substep S142, it is decided whether the verification operation is passed. If not passed (No), the procedure goes to step S15. If passed (Yes), the procedure goes to substep S143. In substep S143, a verification operation for programmed cells may be executed based on the first verification voltage Vfy2. In substep S144, it is decided whether the verification operation is passed. If not passed, the procedure goes to step S15. If passed, the procedure goes to step S145.

Herein, the verification and judgment substeps (e.g., S141 and S142) may constitute a unit verification period. The unit verification period may be repeated a given number of times (e.g., S143 and S144).

As illustrated in FIG. 6, if at least one of the unit verification periods is judged to be failed (No branch of S142 or of S144), then in step S15, an optimal band register may be selected to perform a program operation of the next band. On the other hand, if all of unit verification periods are judged to be passed (Yes branch of S142 and of S144, and of S146), then in step S14, a default band register may be selected to perform a program operation of the next band.

Returning to step S132 in FIG. 6, if the multi-verification operation is judged not to be selected in the selected band register (No branch of step S132), the procedure goes to step S150. First, in substep S151, a verification operation for programmed cells is performed based on a verification voltage for verifying whether cells are programmed to required threshold voltages. In substep S152, there it is decided whether the verification operation is passed. If not passed (No), the procedure goes to step S14, where a default band register may be selected to perform a program operation of the next band. If passed (Yes), the program operation (the write operation) of the non-volatile memory device 100 may be terminated as program pass.

Figure 9:
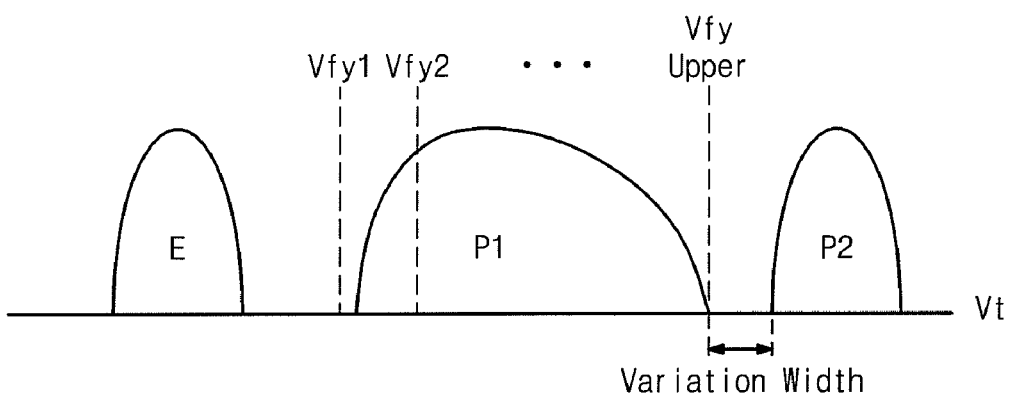
FIG. 9 is a distribution graph for verification levels in FIG. 8.
Figure 8:
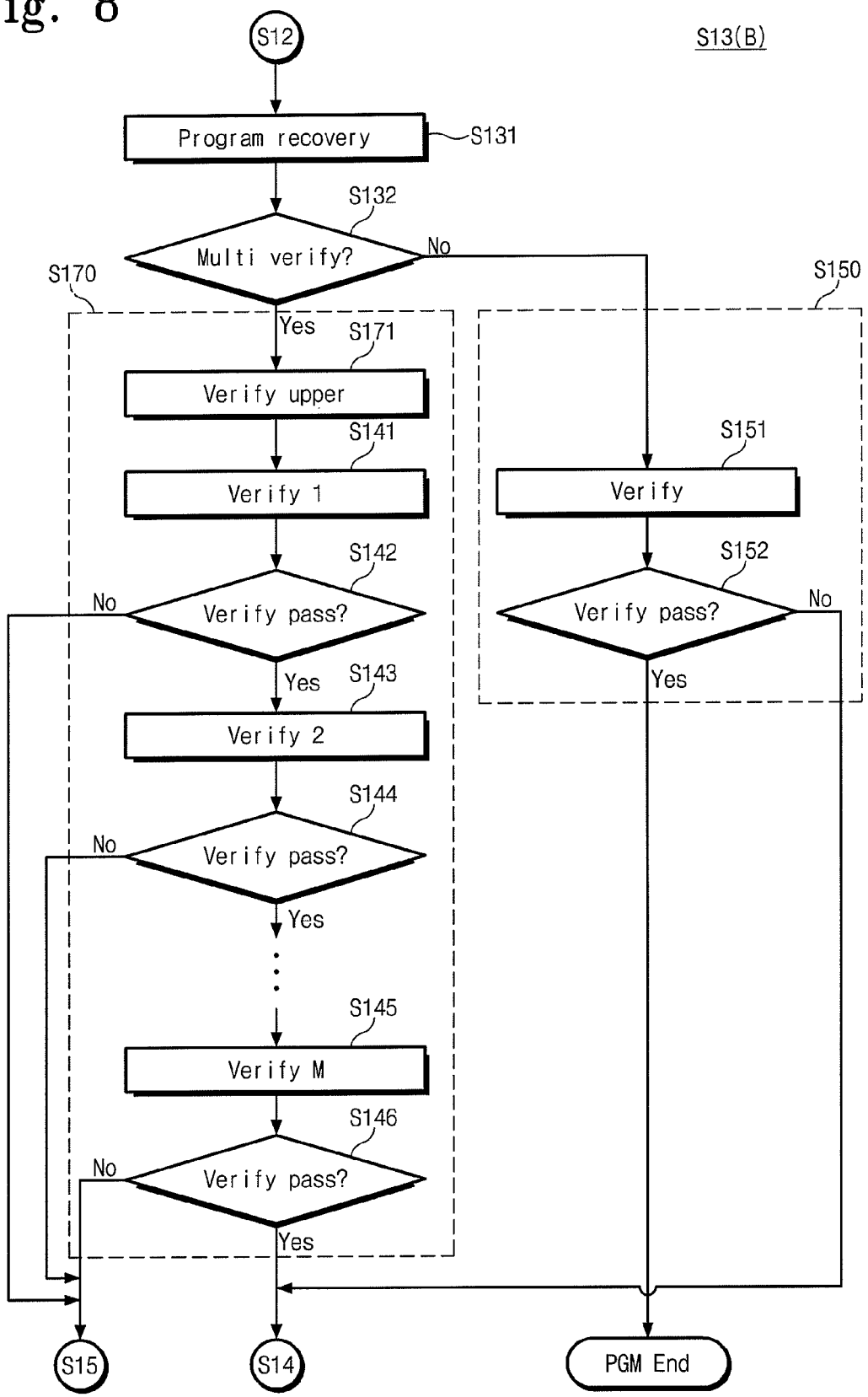
FIG. 8 is a flowchart for more fully describing a verification operation of step S13 in FIG. 4 according to the second exemplary embodiment.

FIG. 8 is a flowchart for more fully describing the verification operation of step S13 in FIG. 4 according to the second exemplary embodiment, and FIG. 9 is a distribution graph for verification levels in FIG. 8. The second exemplary embodiment of the invention in FIG. 8 is identical to the first exemplary embodiment in FIG. 6 except that a multi-verification operation further includes an upper verification operation in substep S171. The upper verification operation may be used to check the distribution width of upper verification to secure program upper limitation. The distribution width of upper verification may be used to select the next band register.

In accordance with the above-described write method, although a program operation of a last band is judged to be failed, a program operation is terminated. But, embodiments of the invention are not limited to this example. The case where a portion of memory cells is not programmed after a program operation of a last band is ended, may exist. For this reason, if such case exists, a program operation may restart from the first band program operation. Herein, a restart number may be set to a given number.

Figure 10:
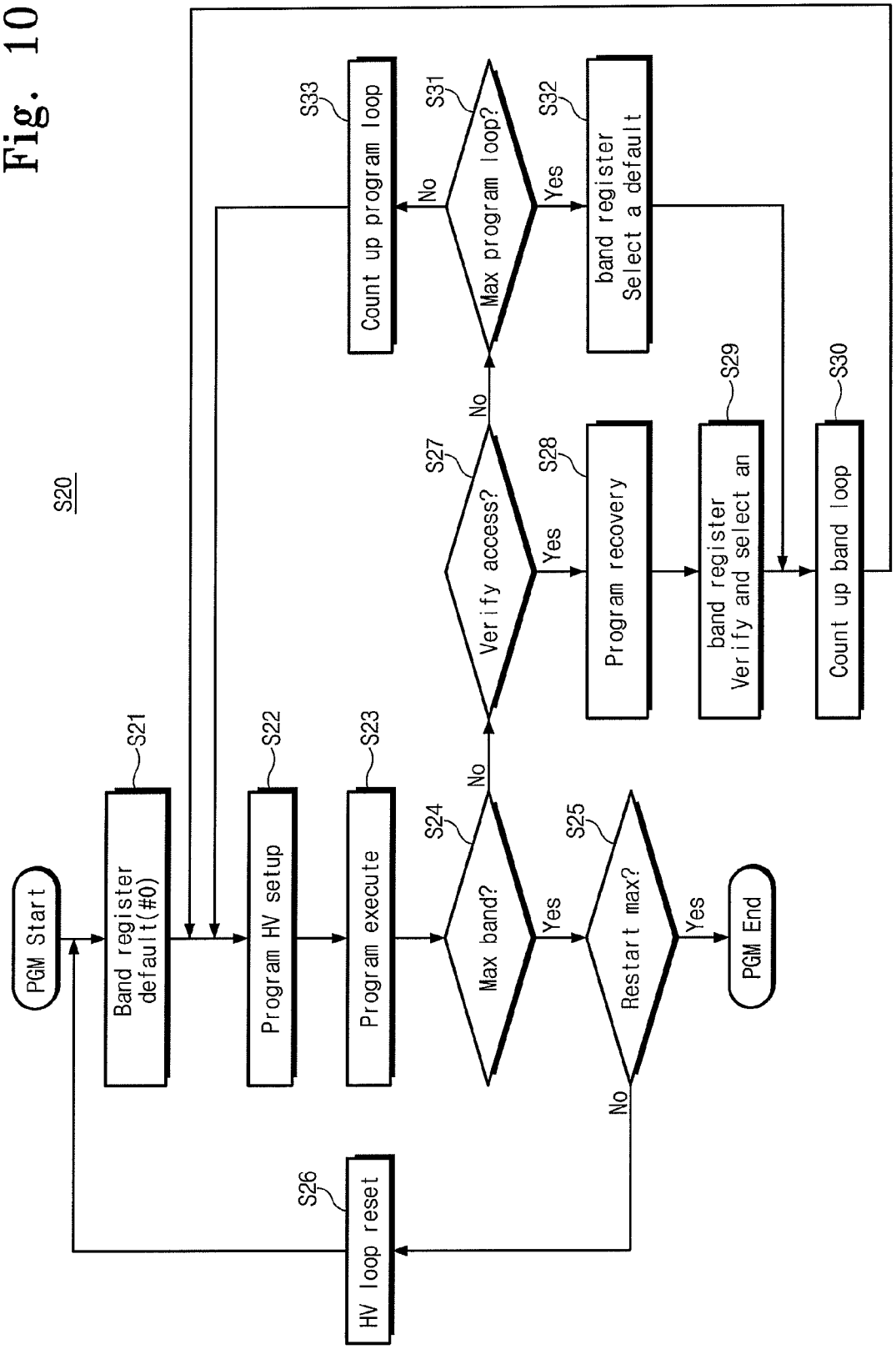
FIG. 10 is a flowchart for describing the second write method of a non-volatile memory device 100 according to an embodiment of the invention.

FIG. 10 is a flowchart for describing an alternative second write method of the non-volatile memory device 100 according to an embodiment of the invention.

In the first band program operation, in step S21, a default band register BR0 may be selected. In voltage setup step S22, high voltages may be set up according to trim information stored in the band register BR0. In step S23, a program operation may be executed by driving a word line, a bit line, and a bulk with the high voltages as illustrated in FIG. 3.

In decision step S24, it is decided whether a band loop number reaches a maximum band loop number. If so (Yes), the procedure advances to decision step S25, in it is decided whether a restart count number reached a maximum value. If the restart count number did not to reach the maximum value (No), in reset step S26, a high voltage loop may be reset and step 21 is repeated. If the restart count restart number reaches the maximum value, the program operation may be terminated as failed.

Returning to step S24, if the band loop number has not reached the maximum band loop number (No), a program operation may be executed with a band loop (or, a band value) being increased. First, in step S27, it is decided whether verification access is set within a current band program operation. This may be decided on the basis of trim information in the selected band register. Thus, the trim information of the selected band register may include data indicating the verification access. The verification access may be used to optionally select an optimal write condition of a next band.

If data indicating execution of the verification access is stored in the band register, in step S28, a program recovery operation is executed. This operation may alternatively be executed within step S23. During the program recovery operation, voltages of word lines, bit lines, and a bulk may be discharged to a ground voltage. Then, the procedure advances to step S29, in which a band register of a next band is selected based on a verification result. In step S30, a band count number for selecting a band may increase by one, and the procedure advances to repeat step S22.

Returning to step S27, if data indicating execution of the verification access is not stored in the band register (No), then the procedures advances to decision step S31, in which it is decided whether a program loop count number in the selected band reached a maximum loop number. In an exemplary embodiment, the maximum loop number may be included in the trim information of the selected band register. If the program loop count number in the selected band did reach the maximum loop number, the procedure goes to step S32, in which a default band register of the next band may be selected. Then procedure advances to step S30 before step S22 is repeated. If the program loop count number in the selected band did not to reach the maximum loop number (No branch of S31), in decision step S33, the program loop count number may increase by one. Then, the procedure advances directly to repeat step S22.

In an preferred embodiment, if data indicating execution of the verification access is not stored in the band register, that means that a verification operation is not performed (or, is skipped).

Figure 11:
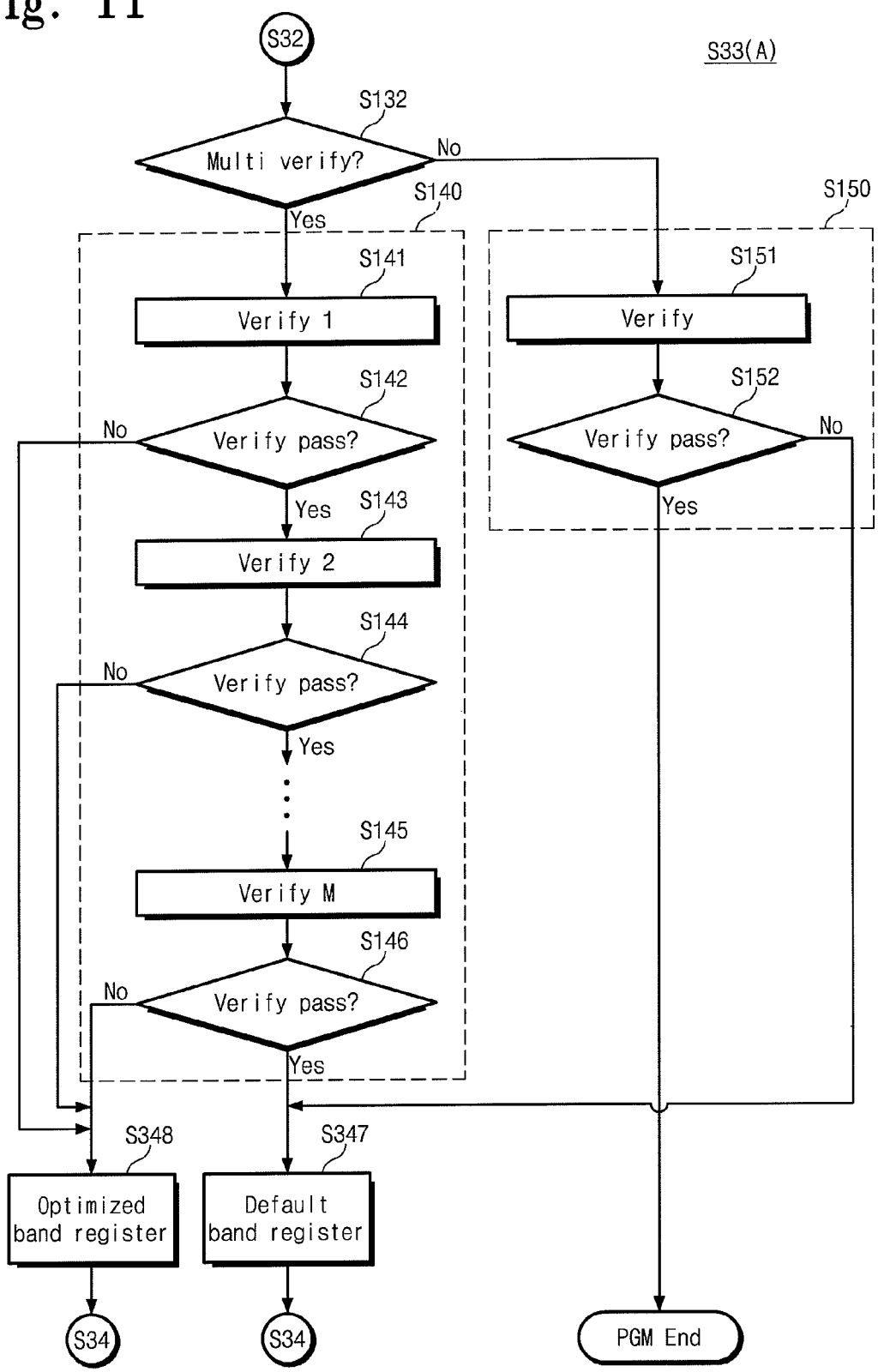
FIG. 11 is a flowchart for describing the first method of selecting a band register to be used at a next band during a verification operation in FIG. 10.

FIG. 11 is a flowchart for describing the first method of selecting a band register to be used for a next band during a verification operation in FIG. 10.

In step S132, it is decided whether a multi-verification operation is selected. In other words, it is decided whether a selected band register is set to execute the multi-verification operation. The multi-verification operation means that a verification operation is performed iteratively using different verification voltages, as illustrated in FIG. 7. If the multi-verification operation is selected (Yes), the procedure advances to step S340 (S141). If the multi-verification operation is not selected (No), the procedure advances to step S150.

The multi-verification operation executed in step S140 (including substeps S141, S142, S143, S144, S145, and S146) is identical to that executed in step 140 of FIG. 6, and repeated description thereof is thus omitted. If at least one of verification operations is judged to be failed (No branch of S142, 144, or 146), the procedure advances to step S378, in which an optimal band register is selected to perform a program operation of the next band. On the other hand, if all of verification operations are judged to be passed (Yes branch of S146), the procedure advances to step S347, in which a default band register is selected to perform a program operation of the next band. Likewise, the verification operation executed in step S150 (including substeps S151 and S152) is identical to that executed in step 150 of FIG. 6, and further description thereof is thus omitted. If a verification operation is judged to be passed (Yes branch of S152), the program operation may be terminated as passed. If a verification operation is judged to be failed (No branch of S152), the procedure goes to step S347.

Figure 12:
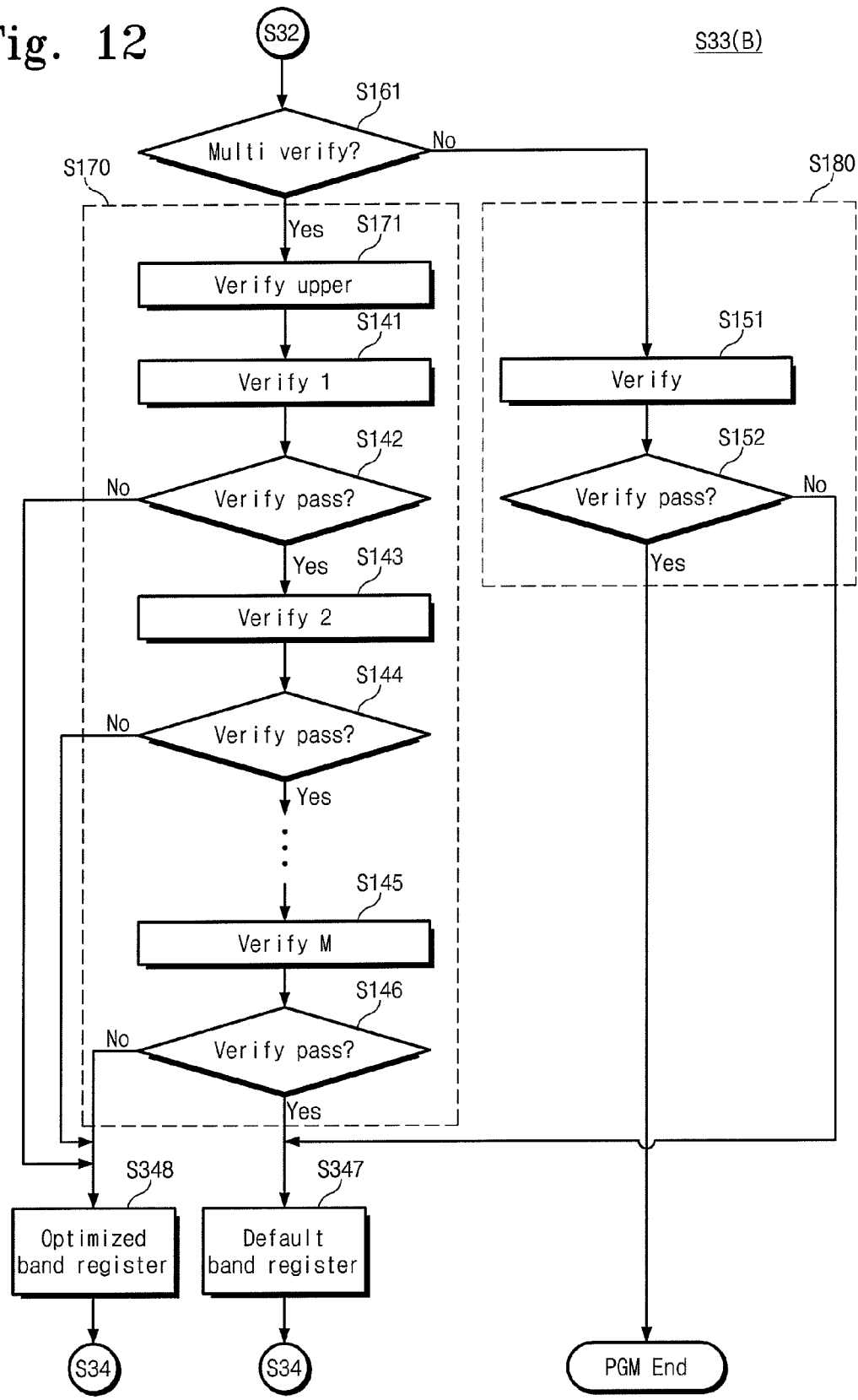
FIG. 12 is a flowchart for describing the second method of selecting a band register to be used at a next band during a verification operation in FIG. 10.

FIG. 12 is a flowchart for describing the second method of selecting a band register to be used at a next band during a verification operation in FIG. 10.

The second embodiment of the invention in FIG. 12 is identical to that in FIG. 11 except that a multi-verification operation further includes an upper verification operation in step S171. The upper verification operation may be used to check a distribution width of upper verification to secure program upper limitation. The distribution width of upper verification may be used to select a next band register.

FIG. 13 is a table showing exemplary trim information stored in band registers according to an exemplary embodiment of the invention.

Referring to FIG. 13, trim information stored in a band register may include a start voltage (Vstart), a step voltage (Vstep), a program time (tPGM), a program cell number (PGMcell), a verification enable/disable bit (Vfy), a multi-verification enable/disable bit (MultiVfy), verification levels (Vfy Levels, in volts), a maximum band loop number (Band Max), a maximum ISPP program loop number (Max Loop), and the like. For example, as shown in FIG. 13 the first band register BR0 may include trim information such as a start voltage of 2V, a step voltage of 2V, a program time of 500 ns, a program cell number of 16, verification disable, multi-verification disable, a maximum band loop number of 2, and a maximum ISPP program loop number of 64.

An exemplary flash memory programming method is described in FIGS. 1 to 13. But, it is possible to variously apply steps of the invention to perform an erase method. Thus, an erase method may include selecting a band register including an optimal erase condition every band and performing an erase operation according to trim information stored in the selected band register.

With the write method of the non-volatile memory device, it is possible to realize an optimized threshold voltage characteristic by dynamically (automatically) selecting an optimal band register. The large threshold voltage margin may be secured.

The non-volatile memory device 100 of FIG. 1 may be applied to construct a memory card and a solid state drive (SSD).

Figure 14:
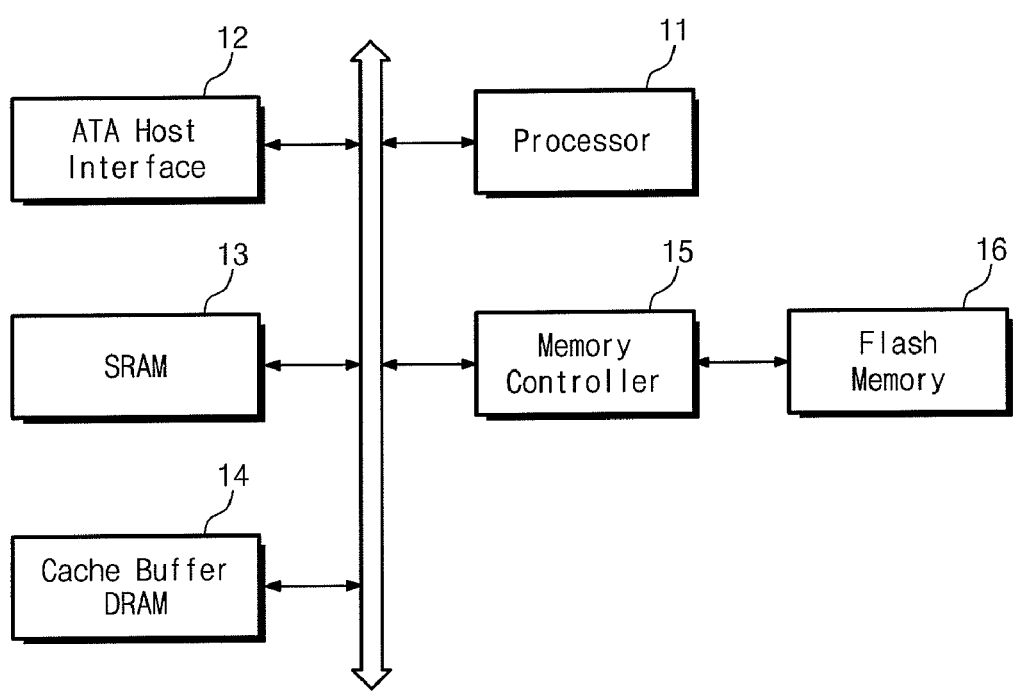
FIG. 14 is a memory system including the non-volatile memory device of FIG. 1.

FIG. 14 is a memory system including a non-volatile memory device 100 of FIG. 1.

Referring to FIG. 14, a memory system 10 may include a memory controller 15 and a flash memory 16. The flash memory 16 may be identical to the non-volatile memory device 100 in FIG. 1, and may be configured to perform the above-described write methods.

A processor 11 may operate in response to a command from a host (not shown) received via an host interface 12, such as for example ATA host interface. The interface 12 may exchange data with the host in response to the control of the processor 11. Data transferred from the host may be temporarily or permanently stored in the flash memory 16 via the memory controller 15, under the control of the processor 11. Data read out from the flash memory 16 via the memory controller 15 may be sent to the host via the interface 12, under the control of the processor 11.

The ATA host interface 12 may send commands and addresses from the host to the processor 11 via a cable or bus (not shown). The ATA host interface 12 may be any one of a serial ATA interface, a parallel ATA interface, an external SATA interface, or another data transfer/cabling standard. Data to be sent to or received from the host via the ATA host interface 12 may be transferred via a cache buffer RAM 14 under the control of the processor 11, without passing the bus (not shown). SRAM 13 may be used to temporarily store data needed to perform operations of the memory system 10. The RAM may be any one of DRAM or SRAM.

The cache buffer RAM 14 may temporarily store data transferred between the host and the flash memory 16. Further, the cache buffer RAM 13 and/or the flash memory 16 may be used to store program code to be executed by the processor 11. The cache buffer RAM 13 may be a buffer memory and formed of SRAM.

The memory controller 15 may be configured to access data within the flash memory 16 which is used as a storage device. The memory controller 15 may be configured to control a NOR flash memory, a NAND flash memory, a One_NAND flash memory, a multi-level flash memory, or the like, configured to perform the above described write methods.

A memory system according to an embodiment of the invention may be used as a portable data storage device. For example, the memory system may be used as an internal storage device of MP3, digital camera, PDA, e-Book, or the like. Further, the memory system may be used as a mass data storage device of a digital TV or a computer.

A memory device 100 and memory controller 15 and other components of the system 10 of FIG. 14 may be packaged according to an embodiment of the invention may be packaged by any one package selected from a group of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The above-described figures are to be considered illustrative, and not restrictive, and the appended claims are intended to cover all modifications, enhancements, and other embodiments, which fall within the true spirit and scope of the invention. Thus, to the maximum extent allowed by law, the scope of the invention is to be determined by the broadest permissible interpretation of the following claims and their equivalents, and shall not be restricted or limited by the foregoing detailed description.

What is claimed is:

1. A non-volatile memory device comprising:
a cell array having memory cells arranged at intersections of word lines and bit lines;
an address decoder configured to select one of the word lines in response to an address;
a write circuit configured to write program data in memory cells connected with the selected word line; and
a control circuit configured to control the address decoder and the write circuit such that a plurality of band write operations are sequentially executed during a write operation,
wherein the control circuit is further configured to select, during each write operation, a write condition of a next band write operation, wherein each band of the plurality of band write operations is executed according to stored trim information for controlling a write condition, wherein the control circuit comprises:
a trim block including a plurality of band registers each band register storing trim information; and
a selector configured to select, the band write operation, one of the plurality of band registers of the trim block that store the trim information.

2. The non-volatile memory device according to claim 1, wherein the trim information of each band register includes data indicating enable/disable of the band register.

3. The non-volatile memory device according to claim 1, wherein the band register storing the trim information is selected according to a result of a verification operation.

4. The non-volatile memory device according to claim 3, wherein the verification operation is executed using a plurality of verification levels.

5. The non-volatile memory device according to claim 3, wherein the verification operation is used to detect a threshold voltage distribution width.

6. The non-volatile memory device according to claim 1, wherein whether cells to be programmed next exist, is decided in each of the plurality of band write operations.

7. A non-volatile memory device comprising:
a cell array having memory cells arranged at intersections of word lines and bit lines;
an address decoder configured to select one of the word lines in response to an address;
a write circuit configured to write program data in memory cells connected with the selected word line; and
a control circuit configured to control the address decoder and the write circuit such that a plurality of band write operations are sequentially executed during a write operation,
wherein the control circuit is further configured to select, during each write operation, a write condition of a next band write operation, wherein the control circuit uses a default write condition when no write condition is selected in the band write operation.

8. A memory system comprising:
a non-volatile memory device; and
a memory controller configured to control the non-volatile memory device,
wherein the non-volatile memory device comprises: a cell array having memory cells arranged at intersections of word lines and bit lines;
an address decoder configured to select on of the word lines in response to an address;
a write circuit configured to write program data in memory cells connected with the selected word line; and
a control circuit configured to control the address decoder and the write circuit such that a plurality of band write operations are sequentially executed during a write operation,
wherein the control circuit is configured to select, during a band write operation, a write condition of a next band write operation, wherein each of the plurality of band write operations is executed according to stored trim information for controlling a write condition, wherein the control circuit comprises:
a trim block including a plurality of band registers each band register storing trim information; and
a selector configured to select, the band write operation, one of the plurality of band registers of the trim block that store the trim information.

9. The memory system according to claim 8, wherein the trim information of each band register includes data indicating enable/disable of the band register.

10. The memory system according to claim 9, wherein the band register storing the trim information is selected according to a result of a verification operation.

11. The memory system according to claim 10, wherein the verification operation is executed using a plurality of verification levels.

12. The memory system according to claim 10, wherein the verification operation is used to detect a threshold voltage distribution width.

13. The memory system according to claim 8, wherein whether cells to be programmed next exist, is decided in each of the plurality of band write operations.

14. A memory system comprising:
a non-volatile memory device; and
a memory controller configured to control the non-volatile memory device, wherein the non-volatile memory device comprises: a cell array having memory cells arranged at intersections of word lines and bit lines;
an address decoder configured to select on of the word lines in response to an address;
a write circuit configured to write program data in memory cells connected with the selected word line; and
a control circuit configured to control the address decoder and the write circuit such that a plurality of band write operations are sequentially executed during a write operation,
wherein the control circuit is configured to select, during a band write operation, a write condition of a next band write operation, wherein the control circuit uses a default write condition when no write condition is selected in the band write operation.

* * * * *